United States Patent [19]

Izumi et al.

[11] Patent Number: 5,189,499
[45] Date of Patent: Feb. 23, 1993

[54] CHARGE-COUPLED DEVICE AND PROCESS OF FABRICATION THEREOF

[75] Inventors: Akio Izumi; Yasuhito Maki; Tadakuni Narabu; Maki Sato; Takaji Otsu; Katsuyuki Saito, all of Kanagawa, Japan

[73] Assignee: Sony Corporation, Tokyo, Japan

[21] Appl. No.: 771,867

[22] Filed: Oct. 8, 1991

Related U.S. Application Data

[63] Continuation of Ser. No. 481,231, Feb. 20, 1990.

[30] Foreign Application Priority Data

Feb. 21, 1990 [JP] Japan ................................ 1-40995

[51] Int. Cl.[5] ....................... H01L 29/76; H01L 27/14
[52] U.S. Cl. .................................... 257/215; 257/222; 257/238; 512/555; 512/538
[58] Field of Search ............... 357/24, 23.4, 30, 23.14; 437/53

[56] References Cited

U.S. PATENT DOCUMENTS

| | | | |
|---|---|---|---|
| 4,236,831 | 12/1980 | Hendrickson | 357/30 |
| 4,538,287 | 8/1985 | Roberts et al. | 357/24 M |
| 4,574,468 | 3/1986 | Slotboom et al. | 357/24 |
| 4,584,697 | 4/1986 | Hazendonk et al. | 357/24 |
| 4,614,960 | 9/1986 | Bluzer | |
| 4,746,622 | 5/1988 | Hawkins et al. | 437/53 |
| 4,974,240 | 11/1990 | Suzuki et al. | 357/24 |

FOREIGN PATENT DOCUMENTS

| | | | |
|---|---|---|---|
| 56-80166 | 7/1981 | Japan . | |
| 57-13764 | 1/1982 | Japan . | |
| 58-15271 | 1/1983 | Japan . | |
| 58-103172 | 6/1983 | Japan | 357/24 |
| 60-35568 | 2/1985 | Japan . | |
| 62-188371 | 8/1987 | Japan | 357/24 |
| 1-17469 | 1/1989 | Japan . | |
| 1-185970 | 7/1989 | Japan | 357/24 |
| 2004694 | 4/1979 | United Kingdom . | |

Primary Examiner—Eugene R. LaRoche
Assistant Examiner—Viet Q. Nguyen
Attorney, Agent, or Firm—Ronald P. Kananen

[57] ABSTRACT

A charge-coupled device has a multi-layer structure insulating layer is formed beneath a transfer electrode, floating electrodes and an electrode adjacent the floating electrodes so that pin hole phenomenon in a charge transfer section of the charge coupled device can be successfully prevented. On the other hand, a sole-layer structure insulating layer is formed beneath a gate electrode of a peripheral component so that a threshold voltage of the gate electrode of the peripheral component can be successfully controlled at a desired value.

3 Claims, 4 Drawing Sheets

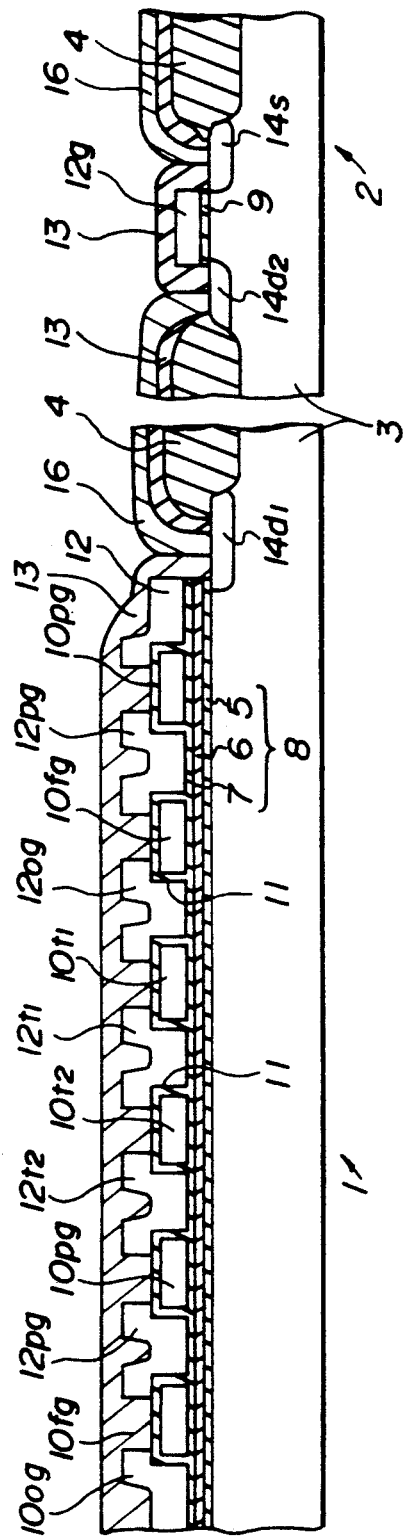
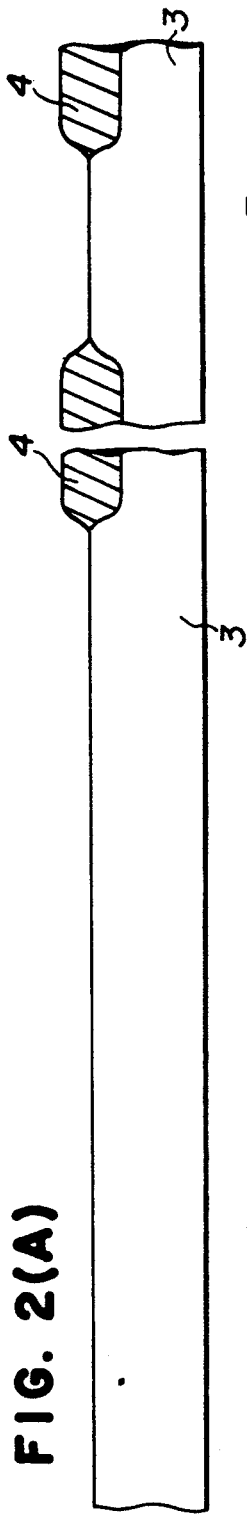
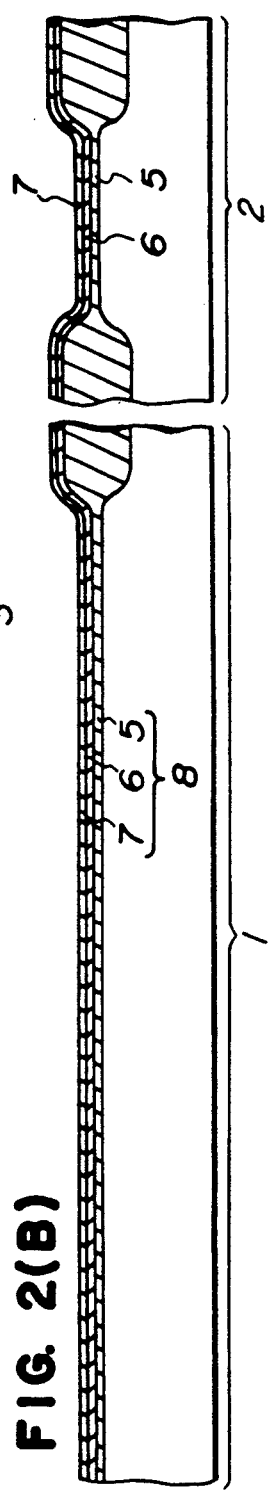
FIG. 1
FIG. 2(A)
FIG. 2(B)

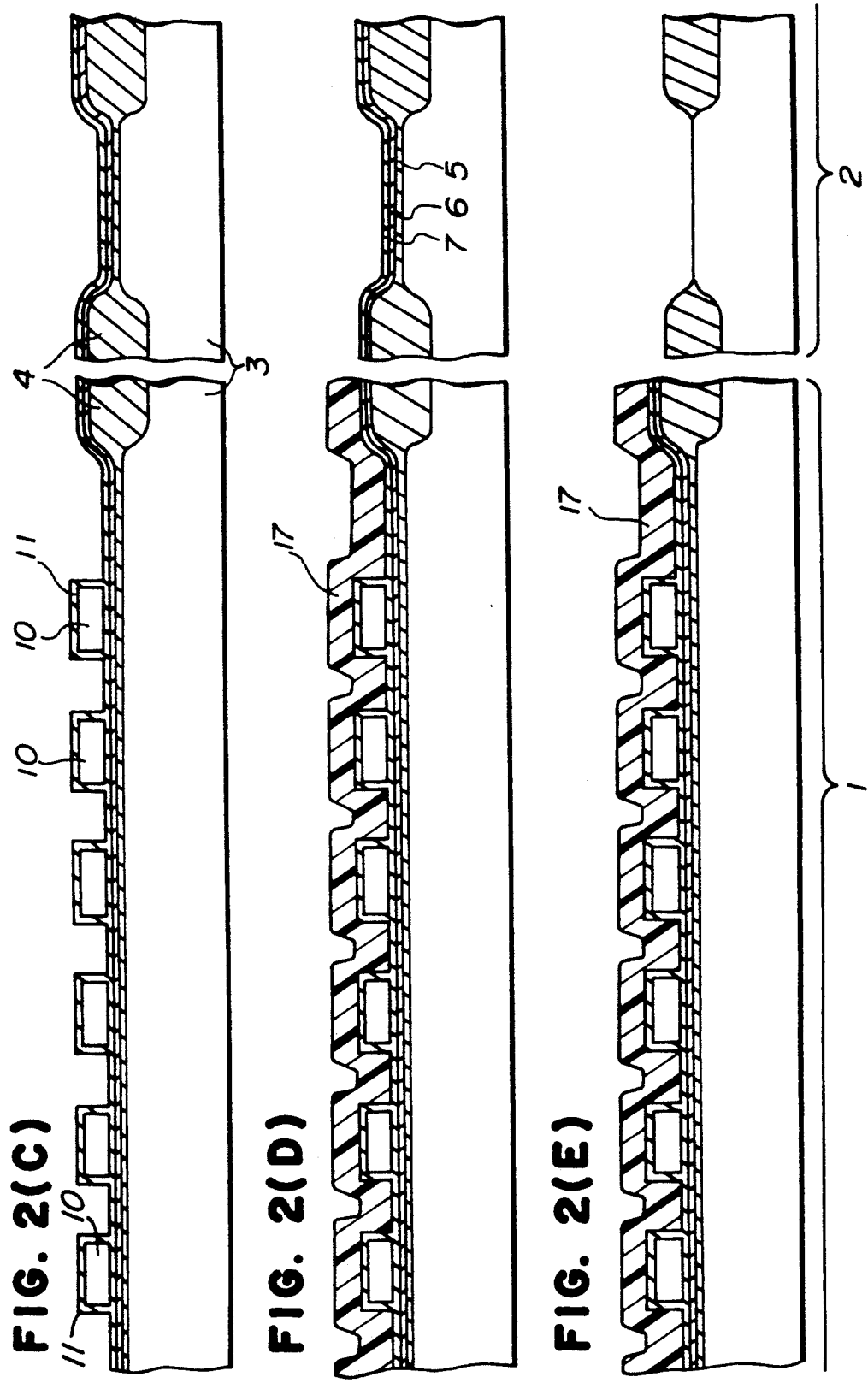

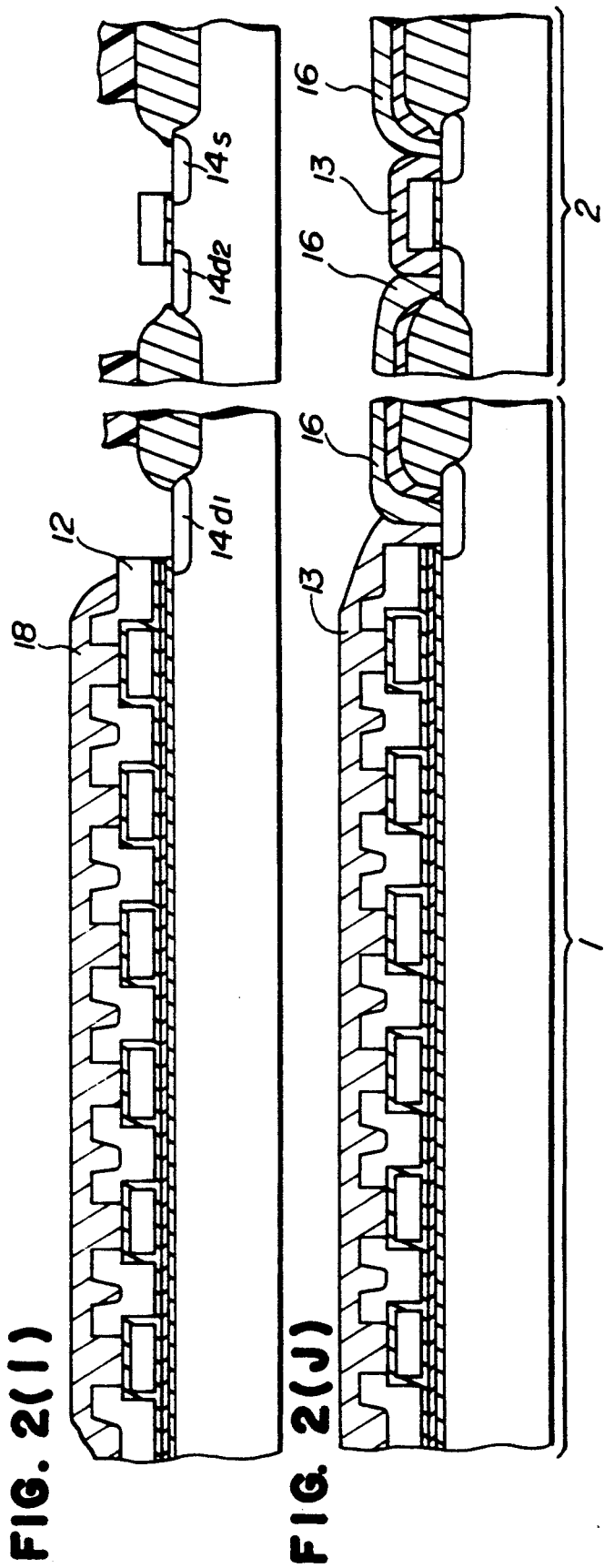

CHARGE-COUPLED DEVICE AND PROCESS OF FABRICATION THEREOF

This application is a continuation of application Ser. No. 07/481,231 filed Feb. 20, 1990.

BACKGROUND OF THE INVENTION

1. Field of the Invention

The present invention relates generally to a charge-coupled device (CCD) and a process for fabricating the same. More specifically, the invention relates to a CCD employing a floating gate amplifier, a distributed floating gate amplifier, or so forth, with a holding capability for controlling threshold voltage at peripheral elements and for preventing pin hole phenomenon.

2. Description of the Background Art

As is well known, CCD's have been principally used for solid state image pick-up devices, semiconductor delay lines and so forth. A CCD is generally composed of a charge transfer section for transferring signalling charge, and a section forming its peripheral components. In most cases, the peripheral components in a CCD comprise MOS transistors. CCD's have various output gate structures, such as a floating diffusion amplifier, a floating gate amplifier, a distributed floating gate amplifier, and so forth.

In such CCD's, gate insulation layers are typically formed by silicon oxide layers. Such silicon oxide layers tend to cause a pin hole phenomenon in the charge transfer section. In order to prevent this undesirable effect, there has been proposed a multi-layer structure having an insulating layer composed of a laminated silicon oxide layer, a silicon nitride layer, and a silicon oxide layer, referred to generally as an ONO structure. Such an ONO structure insulating layer is successful in prevention of the pin hole phenomenon. On the other hand, such an ONO structure insulating layer makes it difficult to obtain a desired threshold voltage at the peripheral components. Therefore, the ONO structure type insulating layer is not at all satisfactory for obtaining a desired performance of the CCD.

In order to solve the aforementioned drawbacks in the sole silicon oxide and ONO structure insulating layer, it is one possible approach to form the insulating layer by a combination of the sole silicon oxide insulating layer and the ONO structure insulating layer. In this possible combination, the ONO structure insulating layer is employed beneath the charge transfer section and the sole semiconductor insulating layer, such as a silicon oxide layer, is employed beneath the other electrodes, such as the gate electrodes of the peripheral components. With such construction, the aforementioned drawback may be resolved. However, on the other hand, such an insulating structure may cause difficulty in reading out a signal beneath the floating gate electrode and in smoothly transferring the signal through the transferring electrode. This is caused by discontinuity of the insulating layers.

Accordingly, this invention is directed to overcoming the drawbacks in the art relating to such CCDs.

SUMMARY OF THE INVENTION

Therefore, it is an overall object of the present invention to provide a charge-coupled device which can solve the problems in the prior art set forth above.

It is another object of the present invention to provide a charge-coupled device which can provide a capability for preventing the pin hole phenomenon and a capability for controlling the threshold voltage at elements in the peripheral components, without causing a degradation of its signal reading and transferring performance.

In order to accomplish the aforementioned and other objects, a charge-coupled device, according to the present invention, has a multi-layer structure wherein an insulating layer is formed beneath a transfer electrode, a floating electrode, and an electrode adjacent the floating electrodes. On the other hand, a sole-layer structure insulating layer is formed beneath a gate electrode of a peripheral component.

According to one aspect of the invention, a charge-coupled device comprises:

a charge transfer section having a plurality of electrodes including at least a transfer electrode and a floating electrode and a multi-layer structure insulating layer having a semiconductor oxide layer and a semiconductor nitride layer, which multi-layer structure insulating layer extends beneath all of said electrodes in said charge transfer section; and a peripheral element having an electrode and a single layer structure insulating layer extending beneath said electrode of said peripheral element.

The electrodes in the charge transfer section further include at least an output gate electrodes and a precharge gate electrode. Preferably, the multi-layer structure insulating layer is composed of a first semiconductor oxide layer, a semiconductor nitride layer and a second semiconductor oxide layer. A plurality of such electrodes may be located on the charge transfer section.

According to another aspect of the invention, a process for fabricating a charge-coupled device comprises the steps of:

forming a multi-layer structure insulating layer, including at least a semiconductor oxide layer and a semiconductor nitride layer in a mutually interfacing fashion, over a semiconductor substrate;

forming a first phase electrode on said multi-layer structure insulating layer;

locally removing said multi-layer structure insulating layer for a region where a peripheral element of the charge-coupled device is to be formed;

forming a single-layer structure insulating layer for the region where said multi-layer structure insulating layer is removed;

forming a second phase electrode of said charge transfer section on said multi-layer structure insulating layer;

forming an electrode of a peripheral element of said charge coupled device on said single-layer structure insulating layer; and removing an extra single-layer structure insulating layer utilizing said electrode of said peripheral element as a mask.

The process may further comprise the steps of forming an insulating layer covering each of the first phase electrodes on said multi-layer and forming a masking layer covering a region of said charge transfer section before the step of removing said multi-layer structure insulating layer. Also, the process may further comprise the steps of forming a surface insulating layer extending over said second phase electrodes and locally removing the surface insulating layer for forming a metallic electrode through a receptacle formed by removal of said surface insulating layer.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment, but are for explanation and understanding only.

In the drawings:

FIG. 1 is a section of the preferred embodiment of a charge-coupled device, according to the present invention; and FIGS. 2(A) to 2(J), are illustrations showing various steps in the fabrication process of the preferred embodiment of the charge coupled device of FIG. 1.

DESCRIPTION OF THE PREFERRED EMBODIMENT

Figure 2F:
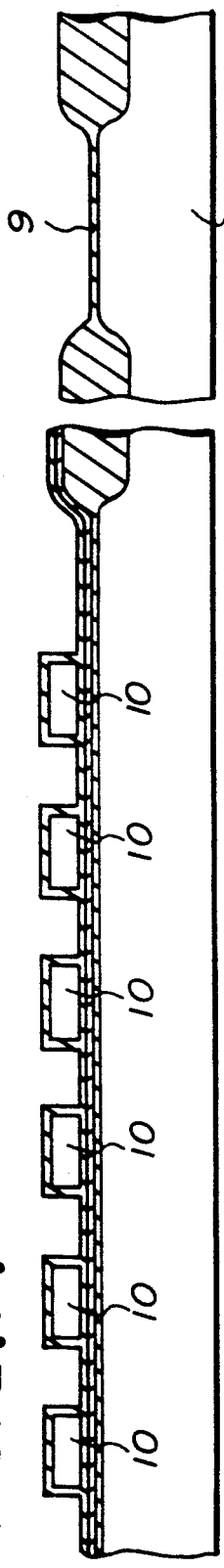

Referring now to the drawings, particularly to FIG. 1, the preferred construction of a charge-coupled device (CCD), according to the present invention, is formed on a silicon substrate 3 as a semiconductor substrate. The CCD generally comprises a charge transfer section 1 and a peripheral element section 2. The preferred construction of the CCD has a floating gate amplifier type output structure, such as a floating gate amplifier or a distributed floating gate amplifier. In the shown construction, the CCD has a plurality of transfer electrodes $10t_1$, $10t_2$ ... $10t_n$ and $12t_1$, $12t_2$ ... $12t_n$, pre-charge gates electrodes $10pg$ and $12pg$, output gate electrodes $10og$ and $12og$ and floating gate electrodes $10fg$ and $12fg$ and thus forms the floating gate amplifier type output structure. The CCD is associated with an MOS transistor as a peripheral component, which MOS transistor has a gate electrode $12g$, a source region $14s$, and a drain region $14d_2$.

The transfer electrodes $10t_1$, $10t_2$ ... $10t_n$ and $12t_1$, $12t_2$ ... $12t_n$, the pre-charge gate electrodes $10pg$ and $12pg$, the output gate electrodes $10og$ and $12og$ and the floating gate electrodes $10fg$ and $12fg$ are respectively formed on a multi-layer structure insulating layer 8. The insulating layer 8 is composed of a first insulating layer comprising a silicon dioxide (SiO2) layer 5 which is formed by heating oxidation performed for the corresponding area of the silicon substrate surface, a second insulating layer 6 comprising a silicon nitride (SiN) layer which is formed by vapor deposition on the first insulating layer, and a third insulating layer 7 comprising a silicon dioxide (SiO2) layer which is formed by vapor deposition on the second insulating layer.

The pre-charge gate electrodes $10pg$ and $12pg$, the output gate electrodes $10og$ and $12og$, and the floating gate electrodes $10fg$ and $12fg$ cooperate with the multi-layer structure insulating layer 8 for forming a charge transfer section 1 having a charge transfer line. As will be seen, respective adjacent electrodes $10pg$, $12pg$, $10fg$, $12og$, $10fg$ and $12fg$ are insulated from each other by an insulating layers 11. Also, the surface of the transfer section 1 is coated by an insulating layer 13. A drain region $14d_1$ is formed in the silicon substrate 8 for draining the signal charge transferred through the transfer line in the charge transfer section 1. The drain region $14d_1$ is separated from the drain region $14d_2$ of the MOS transistor in the section 2 by a field insulating layer 4 which is coated by the insulating layer 13. An aluminum electrode 16 is formed above the insulating layer 13 covering the field insulating layer 4. With this aluminum electrode 16, the drain regions $14d_1$, and $14d_2$ are connected to each other.

As can be seen from FIG. 1, the gate electrode $12g$ of the MOS transistor is formed of a single layer structure insulating layer 9 which comprises a silicon dioxide (SiO2) layer.

With the shown construction, since the insulating layer 9 for the gate electrode $12g$ of the MOS transistor as the peripheral component is formed as a single layer structure silicon dioxide layer, its threshold voltage can be easily set at the designed level substantially in the conventionally known manner. On the other hand, since the multi-layer structure insulating layer 8 is employed for the charge transfer section 1, the pin hole phenomenon will not occur. In addition, since the transfer electrodes $10t_1$, $10t_2$ ... $10t_n$ and $12t_1$, $12t_2$ ... $12t_n$, the pre-charge gate electrodes $10pg$ and $12pg$, the output gate electrodes $10og$ and $12og$ and the floating gate electrodes $10fg$ and $12fg$ are formed on the common multi-layer structure insulating layer 8, a continuity between the electrodes can be provided for enabling a smooth transfer of the signal charge.

The process for fabricating the aforementioned preferred construction of the CCD will be discussed herebelow with reference to FIGS. 2(A) to 2(J).

FIG. 2(A) shows the initial step of the preferred CCD fabrication process according to the present invention. As can be seen, at this step, the silicon substrate 3 is selectively or locally oxidized for forming the field insulating layer 4. Subsequently, as shown in FIG. 2(B), the multi-layer structure insulating layer 8 as previously described is formed on the overall surface of the silicon substrate 3. Practically, in this step of the process, the surface of the silicon substrate 3 is processed for oxidation by heating in order to form the silicon oxide layer 5 as the first insulating layer. As can be seen, the silicon oxide layer 5 thus formed adjoins the field insulating layer 4 formed in the substrate as shown in the step of FIG. 2a. After forming the first insulating layer 5 through the described heat treatment, chemical vapor deposition (CVD) is performed for the overall surface of the first insulating layer 5 for forming the adjacent silicon nitride layer 6 as the second insulating layer. Then, another chemical vapor deposition (CVD) is performed for the overall surface of the second insulating layer 6 for forming the adjacent silicon oxide layer 7 as the third insulating layer. Through the three stage processes, an ONO-type multi-layer structure insulating layer 8 is formed.

Thereafter, as shown in FIG. 2(C), the first phase electrodes 10, each with an adjacent insulating layer 11, are formed. The first phase electrodes 10 are formed by initially and locally performing chemical vapor deposition (CVD) of polycrystalline silicon on the insulating layer 8 and subsequently performing local etching for removing the extra part of the polycrystalline silicon. Then, an adjacent insulating layer 11 is formed by chemical vapor deposition of the silicon oxide. Therefore, after formation, the insulating layer 11 is integrated with the silicon oxide layer 7 as the third insulating layer.

Figure 2G:
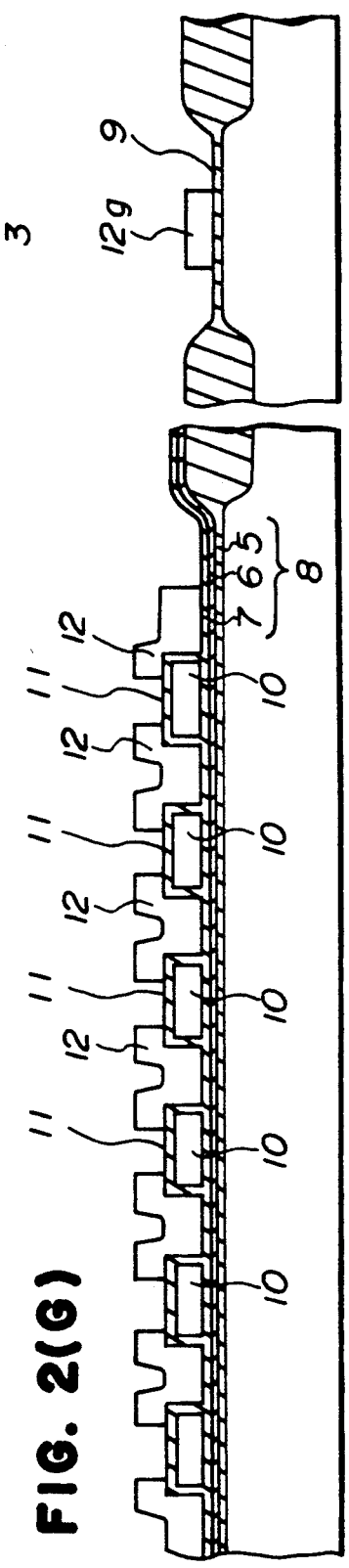

Then, as shown in FIG. 2(D), a resisting layer 17 is formed over the charge transfer section 1. Utilizing the resisting layer 17 as a mask, the insulating layer 8 formed over the area where the MOS transistor or other peripheral components of the CCD are located, is removed by way of etching, as shown in FIG. 2(E). Subsequently, the surface is heat treated while maintaining the resisting layer 17. As a result, a heat-oxidized silicon oxide layer 9 is formed in the region 2 for the peripheral components, as shown in FIG. 2(F). Through this process, the single layer structure insulating layer 9 of the silicon oxide layer is formed for the region 2 forming the peripheral components, such as an MOS transistor. Then, the second phase polycrystalline electrodes 12 for the charge transfer section 1 and the electrode 12n for the peripheral component, e.g., an MOS transistor, are formed as shown in FIG. 2(G). During this process, the resisting layer 17 is removed. The second phase polycrystalline electrodes 12 are formed to have sections extending through the clearance formed between adjacent first phase electrodes 10 for direct contact with the insulating layer 8.

Figure 2H:
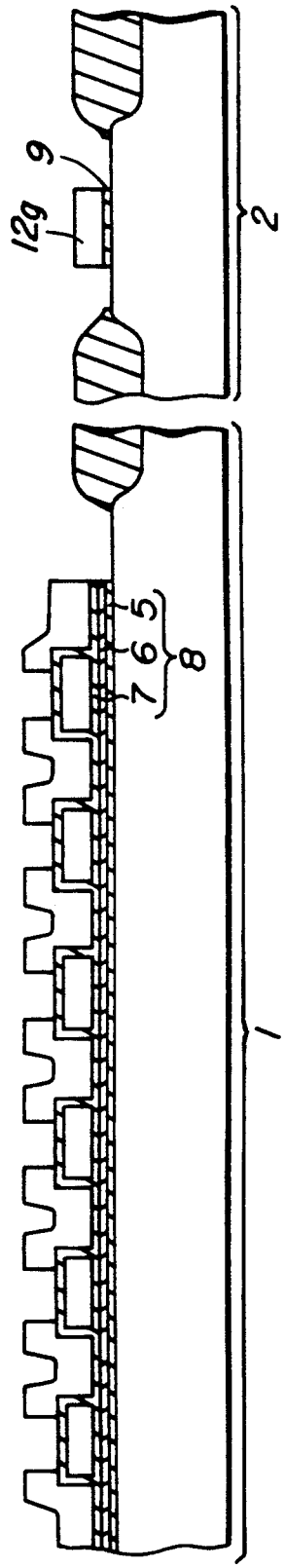

Utilizing the electrodes 12 and 12g as a mask, etching is performed for selectively removing the insulating layers 8 and 9, as shown in FIG. 2(H). Subsequently, an inorganic masking layer 18 is formed while maintaining the regions for which doping of a impurity is to be performed as shown in FIG. 2(I). In this process, for enabling an impurity doping process in self-alignment utilizing the electrodes as masks, the masking layer 18 is formed slightly smaller so as not to cover the peripheral portions of the electrodes. Particularly, for the region 2 to form the peripheral components, it is preferred to concentrate the masking layer 18 on the field insulating layer 4. After forming the masking layer 18, doping of an impurity is performed for forming a source region 14s and drain regions $14d_1$ and $14d_2$, as shown in FIG. 2(I). Subsequently, the insulating layer 13 is formed over the overall surface. Thereafter, the insulating layer 13 is locally etched for forming contact holes. Therefore, the insulating layer 13 covers the charge transfer section 1 and the MOS transistor in the region 2. Then, the aluminum electrodes 16 are formed as shown in FIG. 2(J).

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims. For example, through the shown embodiment is directed to the type of CCD having floating gate amplifier, the invention is applicable for the type of CCD having the distributed floating gate amplifier.

What is claimed is:

1. A charge-coupled device formed on a semiconductor body comprising:
   (a) a charge transfer section including a charge transferring portion and a charge detecting portion, said charge transferring portion having a plurality of transfer electrodes insulated from said semiconductor body by a first insulating layer, said charge detecting portion having a floating gate electrode and a pre-charge electrode, both of which are insulated from said semiconductor body by said first insulating layer, said charge detecting portion formed adjacent to said charge transferring portion;
   (b) said first insulating layer consisting of a first semiconductor oxide layer formed on said semiconductor body, a semiconductor nitride layer formed on said first semiconductor layer, and a second semiconductor oxide layer formed on said nitride layer; and
   a peripheral element at least including a MOS transistor and having a gate electrode insulated from said semiconductor body by a second insulating layer consisting of a single layer and extending beneath said gate electrode of said peripheral element.

2. A charge-coupled device according to claim 1, wherein said floating gate electrode is used to produce an output signal proportional to signal charges transferred by said transfer electrodes.

3. A charge-coupled device according to claim 1, wherein said second insulating layer comprises a semiconductor oxide layer.

* * * * *